United States Patent
Lee et al.

(10) Patent No.: US 7,122,093 B1
(45) Date of Patent: Oct. 17, 2006

(54) GAS-ASSISTED RESIN INJECTION TECHNIQUE FOR BONDING AND SURFACE MODIFICATION IN MICRO-FLUIDIC DEVICES

(75) Inventors: L. James Lee, Columbus, OH (US); Siyi Lai, Madison, WI (US)

(73) Assignee: The Ohio State University, Columbus, OH (US)

(*) Notice: Subject to any disclaimer, the term of this patent is extended or adjusted under 35 U.S.C. 154(b) by 165 days.

(21) Appl. No.: 10/438,278

(22) Filed: May 14, 2003

Related U.S. Application Data (60) Provisional application No. 60/380,523, filed on May 14, 2002.

(51) Int. Cl.
*B32B 37/12* (2006.01)
(52) U.S. Cl. ..................................... 156/292
(58) Field of Classification Search ............... 427/348; 156/152
See application file for complete search history.

(56) References Cited

U.S. PATENT DOCUMENTS

| | | | | |
|---|---|---|---|---|
| 5,932,315 | A | 8/1999 | Lum et al. | 428/172 |
| 6,123,798 | A | 9/2000 | Gandhi et al. | 156/292 |
| 6,176,962 | B1 * | 1/2001 | Soane et al. | 156/292 |
| 6,602,373 | B1 * | 8/2003 | McGuire, Jr. | 156/152 |
| 2002/0125001 | A1 * | 9/2002 | Kelly et al. | 165/165 |

FOREIGN PATENT DOCUMENTS

| | | | |
|---|---|---|---|
| WO | WO0126812 | A1 * | 4/2001 |
| WO | WO0186154 | A1 * | 11/2001 |

OTHER PUBLICATIONS

N.A. Alcantar, E.S. Aydil, and J.N. Israelachvili, "Polyethylene glycol-coated biocompatible surfaces," J. Biomed. Mater. Res. 51(3), pp. 343-351 (2000).

H. Becker and C. Gartner, "Polymer microfabrication methods for microfluidic analytical applications," Electrophoresis 21, pp. 12-26 (2000).

J.H. Chen and E. Ruckenstein, "Surface modification by a two-phase deposition of a surfactant," J. Colloid and Interface Sci. 142(2), pp. 544-553 (1991).

H. Dreuth and C. Heiden, "A method for local application of thin organic adhesive films on micropatterned structures", Materials Science and Engineering, C5, pp. 227-231 (1998).

I.K. Glasgow, D.J. Beebee, and V.E. White, "Design rules for polyimide solvent bonding", Sensors and Materials, 11(5), pp. 269-278 (1999).

L.J. Lee, M.J. Madou, K.W. Koelling, S. Daunert, S. Lai, C.G. Koh, Y-J Juang, Y. Lu, and L. Yu, "Design and fabrication of CD-like microfluidic platforms for diagnostics: microfabrication," Biomedical Microdevice, 3(4), pp. 339-351 (2001).

* cited by examiner

*Primary Examiner*—Richard Crispino
*Assistant Examiner*—Chris Schatz
(74) *Attorney, Agent, or Firm*—Standley Law Group LLP (57) ABSTRACT

A new resin gas-assisted injection technique, which can achieve both bonding and surface modification of microfluidic devices. A sealing resin is injected with a surface modification agent into the microfluidic platform to fill the micron and submicron sized channels and reservoirs, as well as the gap between the platform and the lid. A gas (e.g., air or nitrogen) is then injected to replace most of the resin inside the channels and reservoirs. The remaining resin is cured (fully or partially) by ultraviolet light. By applying a masking technique, local modification of the channel surface can also be achieved through this method. Also provided are methods and structures related to micro-fluidic devices.

36 Claims, 9 Drawing Sheets

GAS-ASSISTED RESIN INJECTION TECHNIQUE FOR BONDING AND SURFACE MODIFICATION IN MICRO-FLUIDIC DEVICES

The present application claims priority to U.S. provisional application No. 60/380,523, filed May 14, 2002, which is hereby incorporated in its entirety by reference.

TECHNICAL FIELD OF THE INVENTION

This invention relates to microfluidic platforms. Specifically, the present invention relates to methods for forming bonded microfluidic devices and methods for general and localized surface modification of microchannels contained in microfluidic platforms. The present invention further relates to classes of micro-electro-mechanical systems including: micro-electro-mechanical devices, biological micro-electro-mechanical devices and micro-optical-electrical-mechanical devices.

BACKGROUND OF THE INVENTION

Microfluidic platforms have attracted a great deal of attention in recent years and extensive research has been conducted in this area. They are a core technology used in a number of miniaturized systems that have been developed for chemical, biological, and medical applications. A wide range of microfluidic devices such as pumps, valves, mixers, and flow sensors has been demonstrated. In the past, these devices have been fabricated almost exclusively in silicon, glass, or quartz by applying techniques available in the microelectronics industry. For many applications, particularly in the life sciences (e.g. analytical chemistry, drug discovery, clinical diagnostics, etc.), these materials and the associated production methods are too expensive, or the material properties often induce problems such as a lack of optical clarity, low impact strength, and poor bio-compatibility. Polymers as substrate materials, on the other hand, provide a wide range of physical and chemical properties. They also have the advantages of low cost, good processibility for mass production, and are biocompatible and recyclable. Polymer microfabrication techniques have attracted great interest in recent years. Various methods (e.g. LIGA, UV-LIGA) and molding technologies (e.g. reactive casting, microembossing, and injection molding) have been applied to fabricate polymer-based microfluidic devices.

After fabrication, these devices need to be sealed in order to perform microfluidic functions. Packaging (i.e. sealing a device with a lid) is a challenging issue in the fabrication of polymer-based microfluidic devices. Bonding between silicon and silicon or other materials (e.g., glass, metal, etc.) is well developed and can be achieved by different methods such as anodic bonding, fusion bonding, eutectic bonding, and adhesive bonding. Among these techniques, only adhesive bonding can be applied to polymer-based microfluidic devices. When using the adhesive bonding method, care needs to be taken in order to prevent the adhesive from flowing into the micro channels. Other techniques such as adhesive tape bonding (lamination), thermal (IR, hot-plate, laser) bonding, ultrasonic welding, and solvent bonding (i.e., partially dissolve the bonding surfaces, and evaporate the solvent) have also been tried. Lum and Greenstein prepared microdepressions on one substrate and microprojections on the other so that the substrates can be mated together to secure the relative position. A layer of monomer or prepolymer was deposited on the microprojections before being mated and further polymerized to provide a bonding effect. Dreuth and Heiden applied a thin adhesive film on a substrate and the adhesive was then transferred to the elevated microstructures by stamp printing. Glasgow et al. introduced a solvent bonding technique in which a layer of polyimide precursor and solvent with dissolved precursor was placed in contact with patterned structures made of uncured polyimide precursor. The two halves were then cured with weights on top of the upper plate. They found that the bond quality was affected by the vent spacing for solvent evaporation, softbake duration, spin-coat speed during solvent application, and the concentration of the dissolved polyimide precursor in the solvent. Basically, these approaches alter the surface of the microdevices by using external forces (e.g. solvent, adhesive, ultrasonic, laser) and applying pressure to bring two halves together. They have problems with either blocking the microchannels or changing their dimensions and are mainly applicable for relatively large microchannels (several hundreds of microns to millimeters).

In most bioMEMS applications, biocompatibility is one of the main requirements for the substrate used due to protein adsorption and cell adhesion on the substrate surface. For instance, blood thrombosis starts with deposition and aggregation of platelets on the surface of the prosthesis. In order to prevent thrombosis, the platelets should be kept from adhering to the surface of the prosthesis. Factors that affect protein adsorption include protein concentration, surface energy/tension, surface roughness, crystallinity, surface charge, etc. The surface free energy has been believed to be the dominant factor in protein adhesion. The thermodynamic driving force for protein deposition is low if the interfacial free energy between the substrate and the bio-fluids is low enough. It is believed that an interfacial free energy with water on the order of 1–3 $mJ/M^2$ could be a criterion for a material being biocompatible. Generally, the interfacial free energy between polymeric materials and bio-fluids is too large to meet the biocompatibility criterion. Therefore, surface modification is necessary to lower the interfacial free energy to produce surfaces that are able to resist cell adhesion and protein adsorption.

A great deal of effort has been devoted to the surface modification of biomaterials by coating the substrate surface with a hydrophilic material, such as polyethylene oxide (PEO) and polyethylene glycol (PEG), or with a surfactant such as sodium dodecyl sulfate (SDS), to increase the surface free energy of the biomaterials. It has been found that a PEG coating can change the surface from hydrophobic to hydrophilic, and thereby reducing protein adsorption and cell adhesion. The two-phase deposition of a surfactant (SDS) on a PMMA surface can also increase the hydrophilicity of a hydrophobic surface.

It is therefore a goal of the present invention to provide a method that can be used to bond microfluidic devices together. It is a further goal of the present invention to provide a method for general surface modification of microchannels in micro-fluidic devices. It is a further goal of the present invention to provide a method for providing localized surface modification of microchannels in micro-fluidic devices.

SUMMARY OF THE INVENTION

The present invention provides a novel approach for the assembly of micro-fluidic devices by using a gas-assist procedure to bond a plurality of members together so as to form a bonded micro-fluidic device.

As used herein, the term "periphery" shall be understood as meaning the outermost part or region within a precise boundary.

As used herein, the term "injecting" shall be understood to also include pulling a blowing agent under vacuum through the micro-channels. That is to say, injecting the blowing agent is equivalent to pulling the blowing agent by vacuum.

In broadest terms, a method for forming bonded micro-fluidic devices of the present invention comprises the steps of: providing at least one first member and at least one second member in adjacent relation so as to form a micro-fluidic device having at least one micro-channel therebetween, the at least one micro-channel having a periphery; injecting a sealing resin between the at least one first member and the at least one second member such that the sealing resin at least partially fills the at least one micro-channel; injecting a blowing agent through the at least one micro-channel so as to at least partially displace the sealing resin to the periphery of the at least one micro-channel thereby forming at least one conduit through the sealing resin, each conduit having a periphery and adapted for fluid flow; and curing the sealing resin so as to bond the at least one first member and the at least one second member together thereby forming a bonded micro-fluidic device. Alternatively, the blowing agent may be pulled through the at least one micro-channel by a vacuum. Curing may simply consist of allowing the sealing resin to dry. Alternatively, the sealing resin may be only partially cured, thereby allowing the members to be separated. The members may then be bonded at a later time by completion of the curing process after re-alignment re-assembly of the members.

It is preferred that the at least one first member is constructed from a material selected from the group consisting of polymers, glasses, silicon, metals, and mixtures thereof. When the at least one first member is constructed from a polymer it is further preferred that the polymer be selected from the group consisting of: polymethyl methacrylate, polystyrene, polycarbonate, polyolefins, polydimethyl siloxane, polyethylene terephthalate, and mixtures thereof. It is more preferred that the at least one first member is constructed from a material having at least one property selected from the group consisting of: hydrophilic, hydrophobic, protein binding, protein rejecting, electrically conductive, electrically semi-conductive, electrically non-conductive, bioactive, and non-bioactive.

It is preferred that the at least one second member is constructed from a material selected from the group consisting of polymers, glasses, silicon, metals, and mixtures thereof. When the at least one second member is constructed from a polymer it is further preferred that the polymer be selected from the group consisting of: polymethyl methacrylate, polystyrene, polycarbonate, polyolefins, polydimethyl siloxane, polyethylene terephthalate, and mixtures thereof. It is more preferred that the at least one second member is constructed from a material having at least one property selected from the group consisting of: hydrophilic, hydrophobic, protein binding, protein rejecting, electrically conductive, electrically semi-conductive, electrically non-conductive, bioactive, and non-bioactive.

The sealing resin may be glue, photocurable resin, solvent-based adhesive, or any other appropriate material. It is preferred that the sealing resin is selected from the group consisting of hydroxyethyl methacrylate, epoxy, urethane, unsaturated polyester, vinylester, acrylic, polystyrene, rubber latex, and mixtures thereof. It is more preferred that the sealing resin has at least one property selected from the group consisting of: hydrophilic, hydrophobic, protein binding, protein rejecting, electrically conductive, electrically semi-conductive, electrically non-conductive, bioactive, and non-bioactive. The sealing resin may additionally comprise an additive such as polyethylene glycol, polyethylene glycol-polypropylene oxide copolymer, surfactants, or combinations thereof.

The blowing agent may be any appropriate blowing agent as will be obvious to those of ordinary skill in the art. It is preferred that the blowing agent is selected from the group consisting of: air, nitrogen, water vapor, water, liquid solvent, non-solvent liquids, other appropriate gases, and mixtures thereof.

Curing may be accomplished by any appropriate process (for example, drying) for the materials selected, as will be obvious to those of ordinary skill in the art. It is preferred that curing is accomplished by a process selected from the group consisting of: ultra-violet exposure, visible light exposure, heating, evaporation, and combinations thereof.

A preferred method for forming bonded micro-fluidic devices of the present invention additionally comprises the step of applying a mask to at least a portion of the micro-fluidic device prior to curing so as to selectively shield portions of the micro-fluidic device from curing. The mask may be selected from any appropriate material based upon the materials selected and the curing process employed, as will be obvious to those of ordinary skill in the art. A suitable mask material comprises chrome-coated glass.

In yet another preferred method for forming bonded micro-fluidic devices of the present invention, the method additionally comprises the steps of: injecting a second sealing resin into at least one conduit; injecting a second blowing agent through the at least one conduit so as to at least partially displace the second sealing resin to the periphery of the at least one conduit thereby forming at least one sub-conduit, each sub-conduit adapted for fluid flow; and curing the second sealing resin. Alternatively, the second blowing agent may be pulled through the at least one conduit by a vacuum.

The second sealing resin may be glue, photocurable resin, solvent-based adhesive, or any other appropriate material. It is preferred that the second sealing resin is selected from the group consisting of hydroxyethyl methacrylate, epoxy, urethane, unsaturated polyester, vinylester, acrylic, polystyrene, rubber latex, and mixtures thereof. It is more preferred that the second sealing resin have at least one property selected from the group consisting of: hydrophilic, hydrophobic, protein binding, protein rejecting, electrically conductive, electrically semi-conductive, electrically non-conductive, bioactive, and non-bioactive. The second sealing resin may additionally comprise an additive such as polyethylene glycol, polyethylene glycol-polypropylene oxide copolymer, surfactants, or combinations thereof.

The second blowing agent may be any appropriate blowing agent as will be obvious to those of ordinary skill in the art. It is preferred that the second blowing agent is selected from the group consisting of: air, nitrogen, water vapor, water, liquid solvents, non-solvent liquids, other appropriate gases, and mixtures thereof.

Curing may be accomplished by any appropriate process (for example, drying) for the materials selected, as will be obvious to those of ordinary skill in the art. It is preferred that curing is accomplished by a process selected from the group consisting of: ultra-violet exposure, visible light exposure, heating, evaporation, and combinations thereof.

In yet another preferred method for forming bonded micro-fluidic devices of the present invention, the method comprises the additional step of applying a second mask to at least a portion of the micro-fluidic device prior to curing the second sealing resin so as to selectively shield portions of the micro-fluidic device from curing. The second mask may be selected from any appropriate material based upon the materials selected and the curing process employed, as will be obvious to those of ordinary skill in the art. A suitable mask material comprises chrome-coated glass.

The present invention also includes bonded micro-fluidic devices formed in accordance with any of the above methods.

The present invention further comprises a method for forming resin conduits in micro-fluidic devices comprising the steps of: providing a micro-fluidic device, the micro-fluidic device comprising at least one micro-channel having a periphery disposed therein; injecting a resin into at least one micro-channel so as to at least partially fill the at least micro-channel; injecting a blowing agent into the at least one micro-channel so as to displace at least a portion of the resin to the periphery of the at least one micro-channel thereby forming at least one conduit having a periphery and adapted for fluid flow; and curing the resin. Alternatively, the blowing agent may be pulled through the at least one-micro-channel by a vacuum.

It is preferred that the micro-fluidic device is constructed from a material selected from the group consisting of polymers, glasses, silicon, metals, and mixtures thereof. When the micro-fluidic device is constructed from a polymer it is further preferred that the polymer be selected from the group consisting of: polymethyl methacrylate, polystyrene, polycarbonate, polyolefins, polydimethyl siloxane, polyethylene terephthalate, and mixtures thereof. It is more preferred that the micro-fluidic device is constructed from a material having at least one property selected from the group consisting of: hydrophilic, hydrophobic, protein binding, protein rejecting, electrically conductive, electrically semi-conductive, electrically non-conductive, bioactive, and non-bioactive.

The resin may be glue, photocurable resin, solvent-based adhesive, or any other appropriate material. It is preferred that the resin is selected from the group consisting of hydroxyethyl methacrylate, epoxy, urethane, unsaturated polyester, vinylester, acrylic, polystyrene, rubber latex, and mixtures thereof. It is more preferred that the resin has at least one property selected from the group consisting of: hydrophilic, hydrophobic, protein binding, protein rejecting, electrically conductive, electrically semi-conductive, electrically non-conductive, bioactive, and non-bioactive. The resin may additionally comprise an additive such as polyethylene glycol, polyethylene glycol-polypropylene oxide copolymer, surfactants, or combinations thereof.

The blowing agent may be any appropriate blowing agent as will be obvious to those of ordinary skill in the art. It is preferred that the blowing agent is selected from the group consisting of: air, nitrogen, water vapor, water, liquid solvents, non-solvent liquids, other appropriate gases, and mixtures thereof.

Curing may be accomplished by any appropriate process for the materials selected, as will be obvious to those of ordinary skill in the art. It is preferred that curing is accomplished by a process selected from the group consisting of: ultra-violet exposure, visible light exposure, heating, evaporation, and combinations thereof.

A preferred method for forming resin conduits in micro-fluidic devices of the present invention additionally comprises the step of applying a mask prior to curing so as to selectively shield portions of the resin from curing. The mask may be selected from any appropriate material based upon the materials selected and the curing process employed, as will be obvious to those of ordinary skill in the art. A suitable mask material comprises chrome-coated glass.

In yet another preferred method for forming resin conduits in micro-fluidic devices of the present invention additionally comprises the steps of: injecting a second resin into at least one conduit; injecting a second blowing agent through the at least one conduit so as to at least partially displace the second resin to the periphery of the at least one conduit thereby forming at least one sub-conduit, each sub-conduit adapted for fluid flow; and curing the second resin. Alternatively, the second blowing agent may be pulled through the at least one conduit under vacuum.

The second resin may be glue, photocurable resin, solvent-based adhesive, or any other appropriate material. It is preferred that the second resin is selected from the group consisting of hydroxyethyl methacrylate, epoxy, urethane, unsaturated polyester, vinylester, acrylic, polystyrene, rubber latex, and mixtures thereof. It is more preferred that the second resin have at least one property selected from the group consisting of: hydrophilic, hydrophobic, protein binding, protein rejecting, electrically conductive, electrically semi-conductive, electrically non-conductive, bioactive, and non-bioactive. The second sealing resin may additionally comprise an additive such as polyethylene glycol, polyethylene glycol-polypropylene oxide copolymer, surfactants, or combinations thereof.

The second blowing agent may be any appropriate blowing agent as will be obvious to those of ordinary skill in the art. It is preferred that the second blowing agent is selected from the group consisting of: air, nitrogen, water vapor, water, liquid solvents, non-solvent liquids, other appropriate gases, and mixtures thereof.

Curing may be accomplished by any appropriate process (for example, drying) for the materials selected, as will be obvious to those of ordinary skill in the art. It is preferred that curing is accomplished by a process selected from the group consisting of: ultra-violet exposure, visible light exposure, heating, evaporation, and combinations thereof.

In yet another preferred method for forming resin conduits in micro-fluidic devices of the present invention, the method comprises the additional step of applying a second mask to at least a portion of the micro-fluidic device prior to curing the second resin so as to selectively shield portions of the micro-fluidic device from curing. The second mask may be selected from any appropriate material based upon the materials selected and the curing process employed, as will be obvious to those of ordinary skill in the art. A suitable second mask material comprises chrome-coated glass.

The present invention further comprises a resin conduit in a micro-fluidic device formed in accordance with any of the above mentioned methods.

The present invention further comprises a bonded micro-fluidic device comprising: at least two members disposed in adjacent relation so as to form a micro-fluidic device having at least one micro-channel therebetween, the at least one micro-channel having a periphery; and a sealing resin disposed between the at least two members so as to bond each member to at least one other member, the sealing resin further disposed in at least one micro-channel about the periphery so as to provide at least one fluid conduit adapted for fluid flow, each fluid conduit having a periphery.

It is preferred that at least one member is constructed from a material selected from the group consisting of polymers, glasses, silicon, metals, and mixtures thereof. When at least one member is constructed from a polymer it is further preferred that the polymer be selected from the group consisting of: polymethyl methacrylate, polystyrene, polycarbonate, polyolefins, polydimethyl siloxane, polyethylene terephthalate, and mixtures thereof. It is more preferred that at least one member is constructed from a material having at least one property selected from the group consisting of: hydrophilic, hydrophobic, protein binding, protein rejecting, electrically conductive, electrically semi-conductive, electrically non-conductive, bioactive, and non-bioactive.

The sealing resin may be glue, photocurable resin, solvent-based adhesive, or any other appropriate material. It is preferred that the sealing resin is selected from the group consisting of hydroxyethyl methacrylate, epoxy, urethane, unsaturated polyester, vinylester, acrylic, polystyrene, rubber latex, and mixtures thereof. It is more preferred that the sealing resin has at least one property selected from the group consisting of: hydrophilic, hydrophobic, protein binding, protein rejecting, electrically conductive, electrically semi-conductive, electrically non-conductive, bioactive, and non-bioactive. The sealing resin may additionally comprise an additive such as polyethylene glycol, polyethylene glycol-polypropylene oxide copolymer, surfactants, or combinations thereof.

In a preferred bonded micro-channel device of the present invention, the bonded micro-fluidic device further comprises at least one second sealing resin disposed in at least a portion of at least one fluid conduit. The second sealing resin may be disposed about the periphery of the fluid conduit. The second sealing resin may be glue, photocurable resin, solvent-based adhesive, or any other appropriate material. It is preferred that the second sealing resin is selected from the group consisting of hydroxyethyl methacrylate, epoxy, urethane, unsaturated polyester, vinylester, acrylic, polystyrene, rubber latex, and mixtures thereof. It is more preferred that the second sealing resin have at least one property selected from the group consisting of: hydrophilic, hydrophobic, protein binding, protein rejecting, electrically conductive, electrically semi-conductive, electrically non-conductive, bioactive, and non-bioactive. The second sealing resin may additionally comprise an additive such as polyethylene glycol, polyethylene glycol-polypropylene oxide copolymer, surfactants, or combinations thereof.

A micro-fluidic device having coated micro-channel surfaces of the present invention comprises: a body having at least one micro-channel disposed therein, each micro-channel having a periphery; and at least one layer of coating disposed about at least a portion of the periphery of the at least one micro-channel thereby forming at least one conduit, each conduit having a periphery and adapted for fluid flow.

It is preferred that the body is constructed from a material selected from the group consisting of: polymers, glasses, silicon, metals, and mixtures thereof. When the body is constructed from a polymer it is further preferred that the polymer be selected from the group consisting of: polymethyl methacrylate, polystyrene, polycarbonate, polyolefins, polydimethyl siloxane, polyethylene terephthalate, and mixtures thereof. It is more preferred that the body is constructed from a material having at least one property selected from the group consisting of: hydrophilic, hydrophobic, protein binding, protein rejecting, electrically conductive, electrically semi-conductive, electrically non-conductive, bioactive, and non-bioactive.

Each layer of coating may comprise any glue, photocurable resin, solvent-based adhesive, or any other appropriate material. It is preferred that at least one layer of the coating is constructed from a material selected from the group consisting of hydroxyethyl methacrylate, epoxy, urethane, unsaturated polyester, vinylester, acrylic, polystyrene, rubber latex, and mixtures thereof. It is more preferred that at least one layer of coating has at least one property selected from the group consisting of: hydrophilic, hydrophobic, protein binding, protein rejecting, electrically conductive, electrically semi-conductive, electrically non-conductive, bioactive, and non-bioactive.

Depending on the properties of coating resins and blowing agents employed, the processing conditions used, and the dimensions of the micro-channels, the coating layer may consume more than 60% of the cross-sectional area of the micro-channel.

The coating may be partially cured to a semi-solid adhesive, thereby allowing the lid to be removed, if necessary. A plastic film may cover a partially cured coating. Then, at a later time the film can be removed and the body sealed to a lid by completing the curing of the coating layer.

DETAILED DESCRIPTION OF THE PREFERRED EMBODIMENT(S)

In accordance with the foregoing summary, the following presents a detailed description of the preferred embodiment of the invention that is currently considered to be the best mode.

Figure 1:
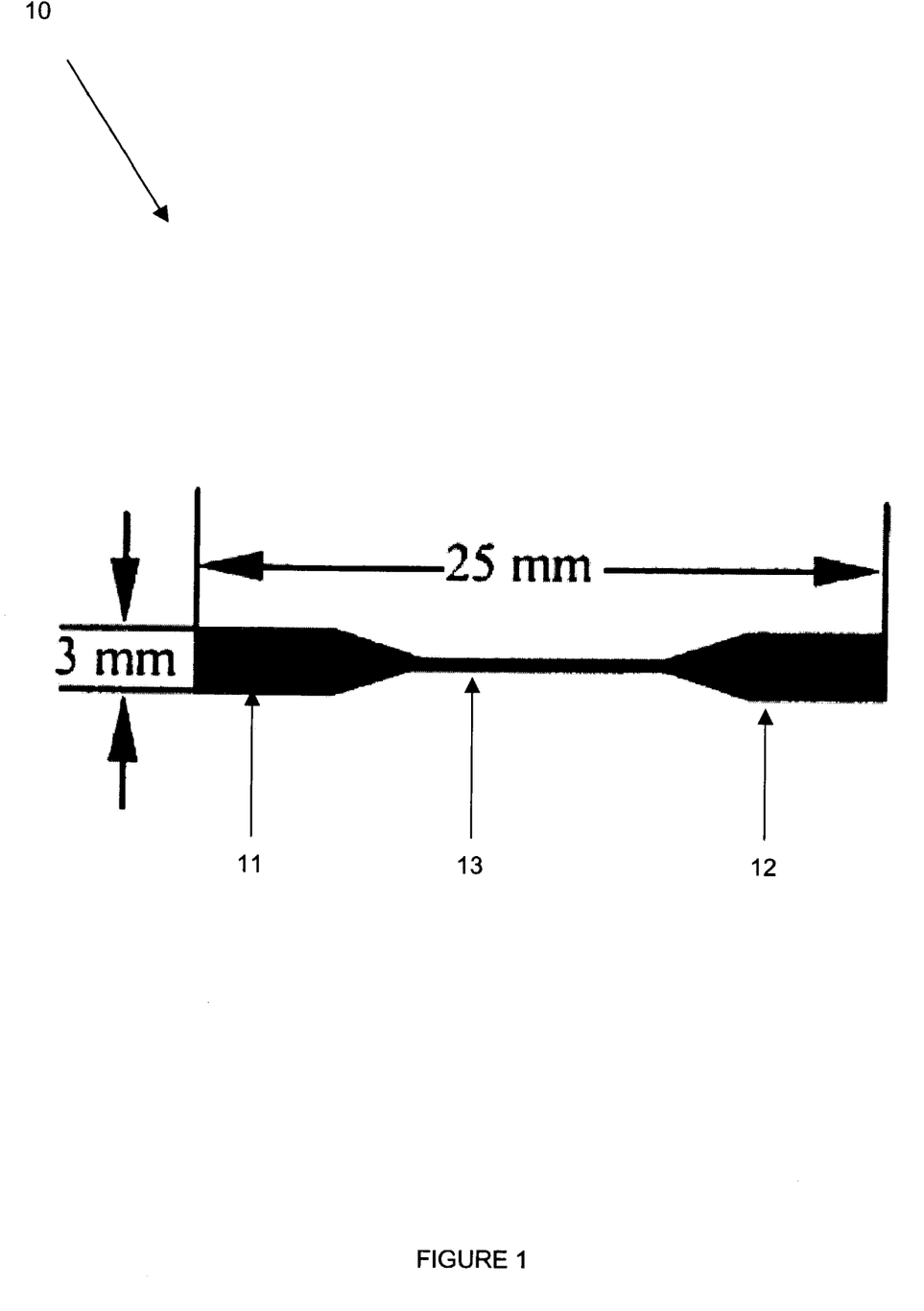
FIG. 1 illustrates two reservoirs connected by a channel in a single channel micro-fluidic device formed in accordance with the present invention.

FIG. 1 details the structure of a cavity 10 in a micro-fluidic device of the present invention. The cavity 10 has a first reservoir 11 and a second reservoir 12 connected by a channel 13. As indicated in FIG. 1, the cavity has an overall width of 3 mm and an overall length of 25 mm. The channel 13 is approximately 100-micrometers wide.

Figure 2:
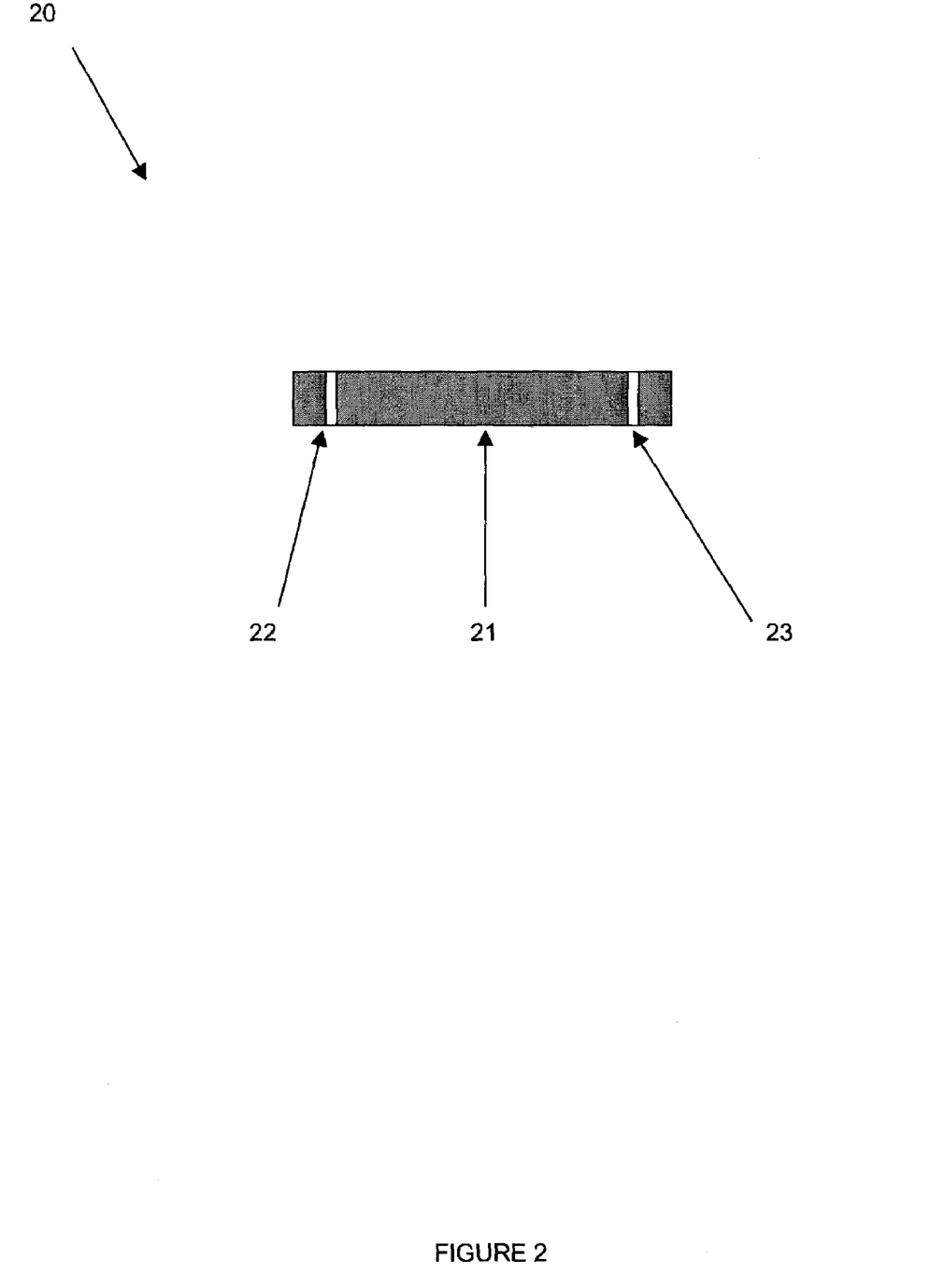
FIG. 2 shows a side view of the lid for the single channel micro-fluidic device of FIG. 1.
Figure 3:
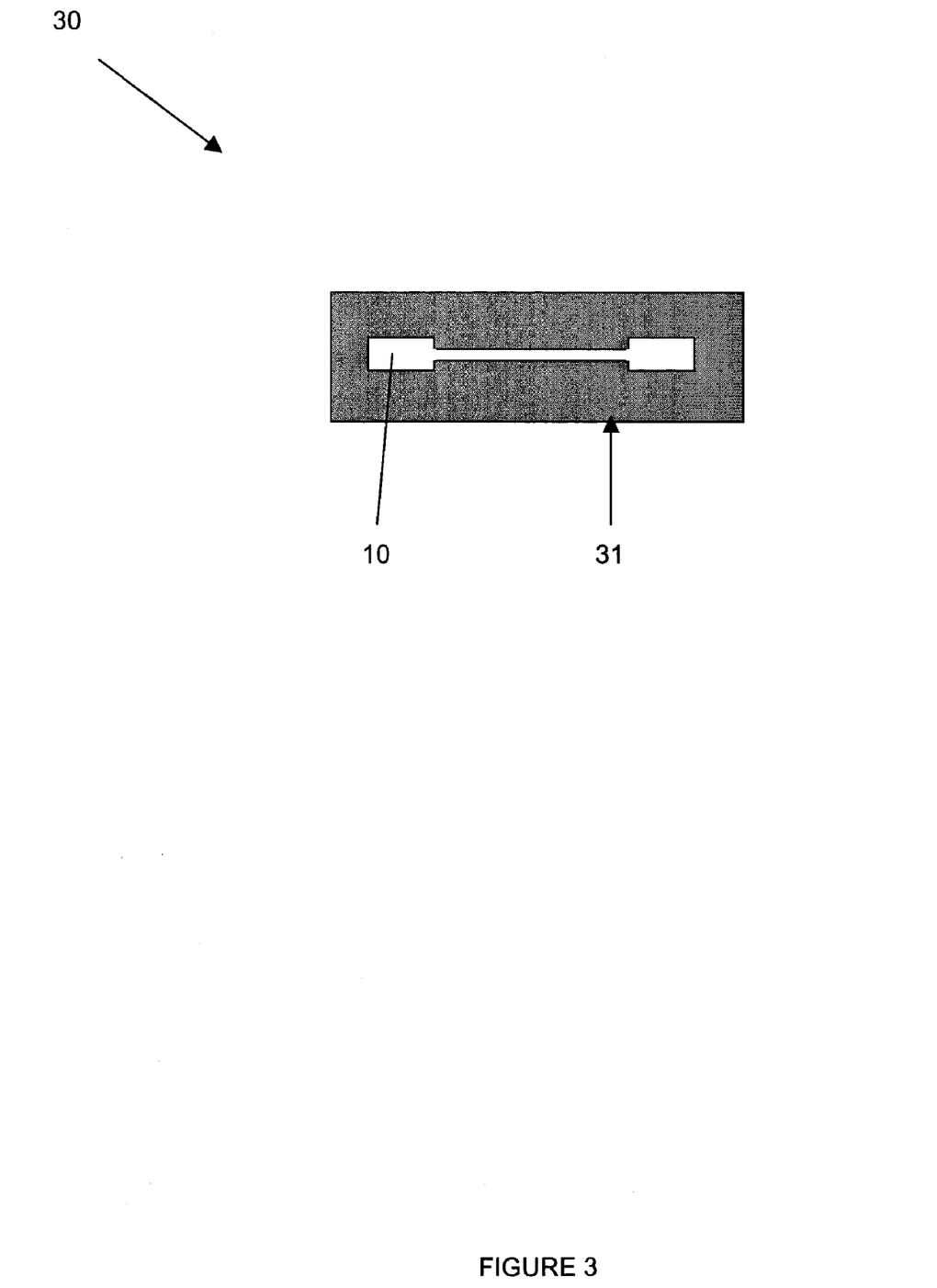
FIG. 3 shows a top view of the base for the single channel micro-fluidic device of FIG. 1.
Figure 4:
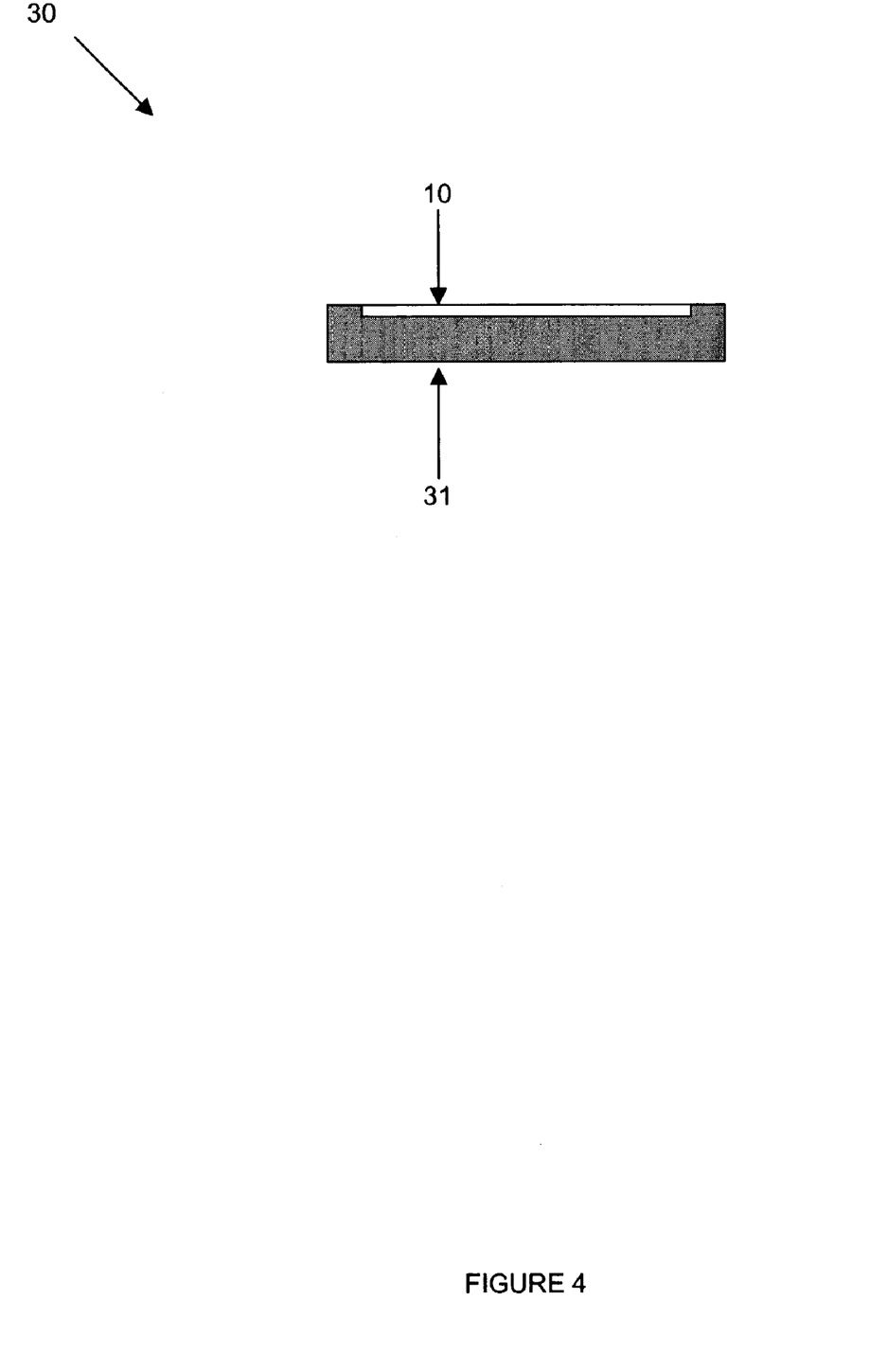
FIG. 4 shows a side view of the base for the single channel micro-fluidic device of FIG. 1.

FIG. 2 is a side view of a lid 20 that will be bonded to the base (shown in FIGS. 3 and 4). The lid 20 comprises a body 21, an entry hole 22 and an exit hole 23. The lid 20 is constructed such that entry hole 22 is over the first reservoir 11 when the lid is mated with the base. The lid 20 is further constructed such that exit hole 23 is over the second reservoir 12 when the lid is mated with the base.

FIG. 3 shows a top view of the base 30. The base 30 comprises a body 31 and has disposed therein cavity 10. Base 30 is adapted to mate with lid 20 so as to encase cavity 10 therebetween.

FIG. 4 shows a side view of the base 30, including the respective position of cavity 10 disposed in body 31.

Figure 5:
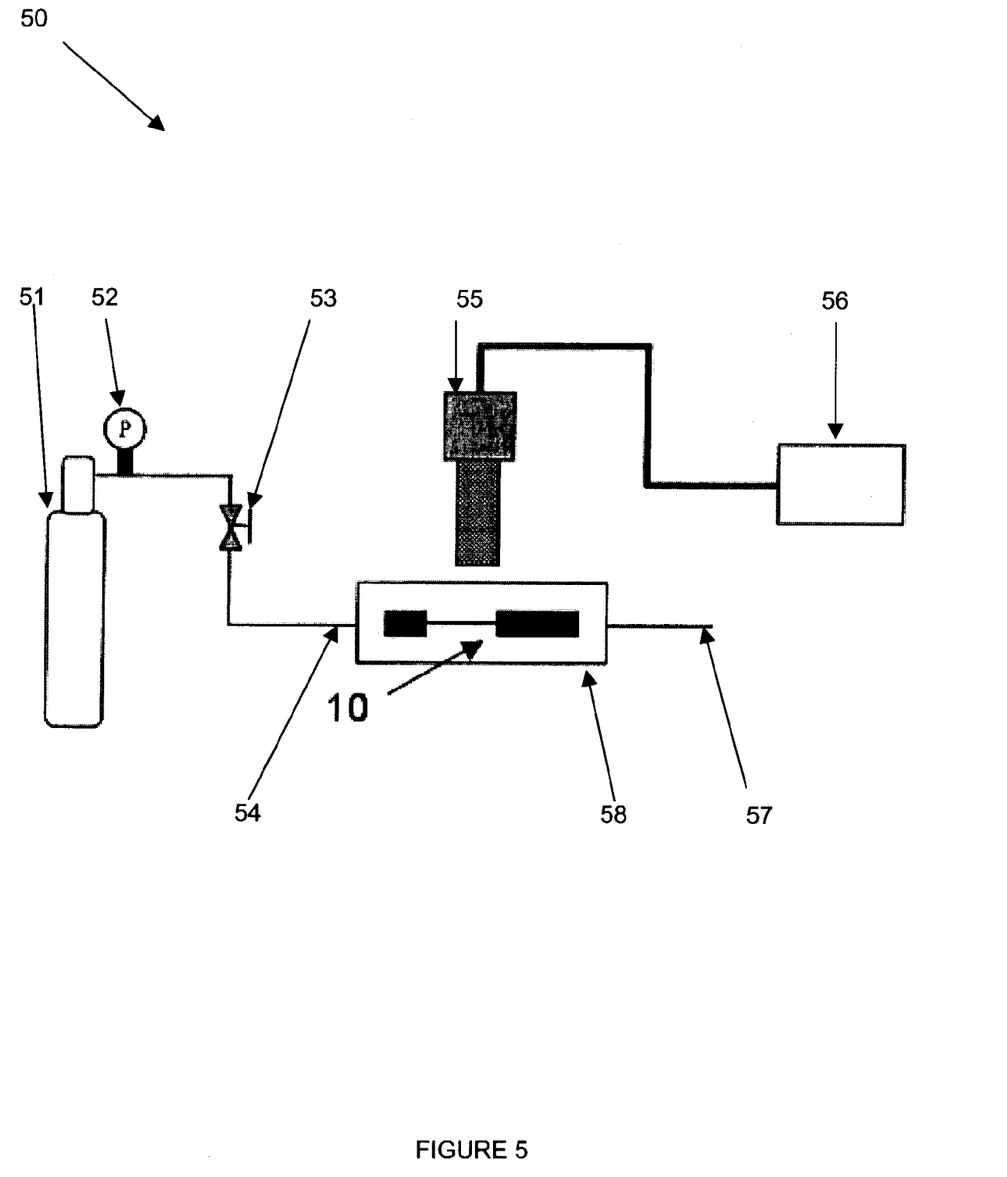
FIG. 5 is a schematic of the experimental setup used for bonding and surface modification of micro-fluidic devices of the present invention.

FIG. 5 shows the experimental setup 50 used for the gas assisted resin injection technique of the present invention. Experimental setup 50 comprises: a tank of compressed gas (for example nitrogen) 51, a pressure gauge 52 indicating the pressure of the compressed gas in tank 51, a valve 53 for controlling the flow rate of compressed gas, an input line 54, an exit line 57. The experimental setup additionally comprises micro-fluidic device 58 (comprising lid 20 and base 30). The experimental setup is shown with video camera 55 and VCR 56 set up so as to capture images of cavity 10 filling with resin. In experimental setup 50, input line 54 is in fluid communication with entry hole 22. Exit line 57 is in fluid communication with exit hole 23. Thus, gas entering the micro-fluidic device through entry hole 22 traverses cavity 10 prior to being expelled through exit hole 23.

Figure 6:
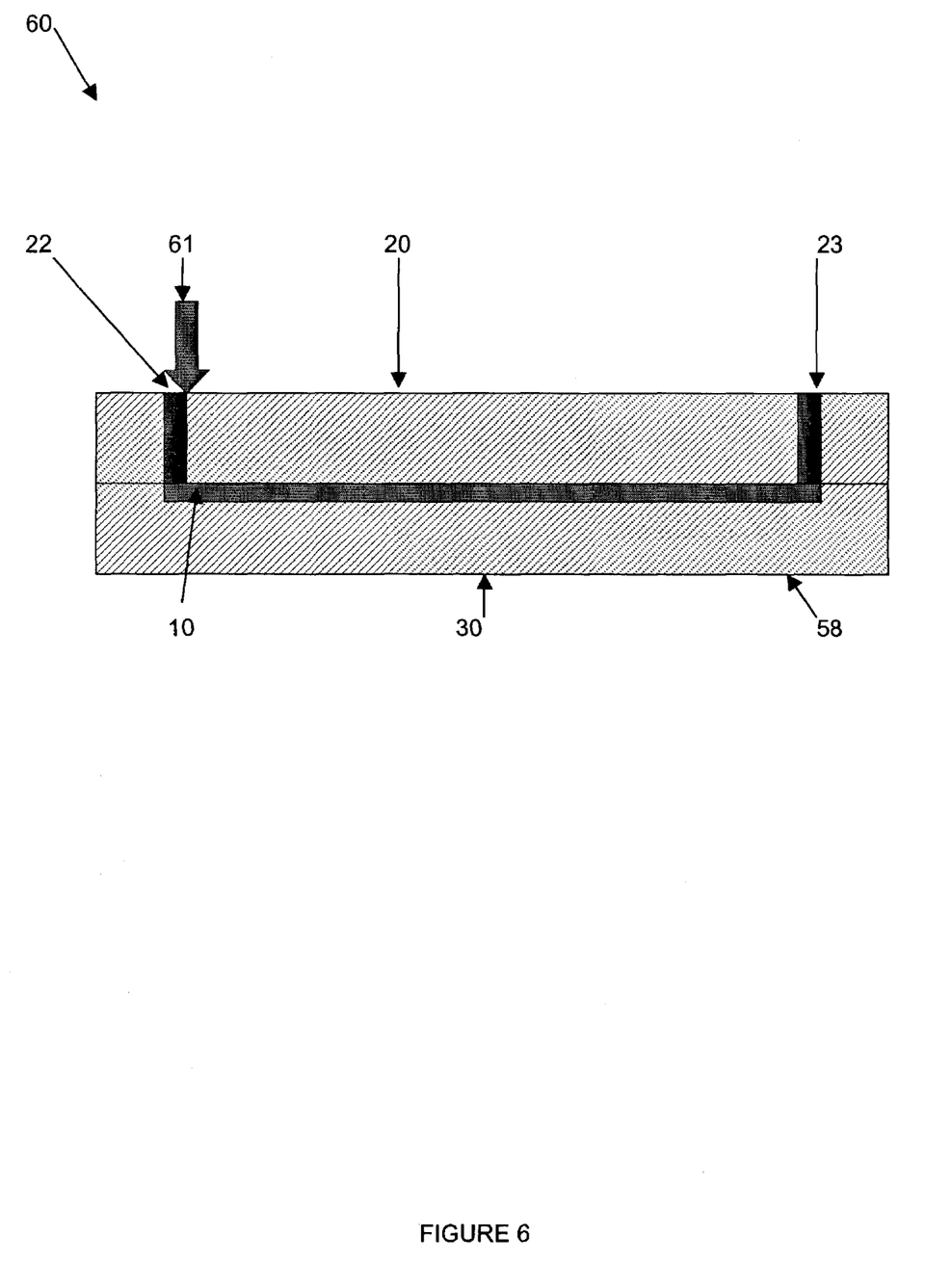
FIG. 6 shows a cross-sectional view of the single channel micro-fluidic device during the sealing resin injection step.

FIG. 6 provides a cross-sectional image 60 of the micro-fluidic device 58 during the resin injection stage of the process. As shown, resin 61 is injected into entry hole 22 so as to fill cavity 10. The resin 61 exits cavity 10 through exit hole 23. By adjusting the pressure under which the resin is injected, and the pressure under which lid 20 and base 30 are held together, resin 61 can be forced into the mating region outside of the cavity 10 and between the lid 20 and base 30. By forcing the resin into the mating region between the lid and the base (that is, the region not occupied by cavity 10), the lid and base may be bonded together by the resin upon curing.

Figure 7:
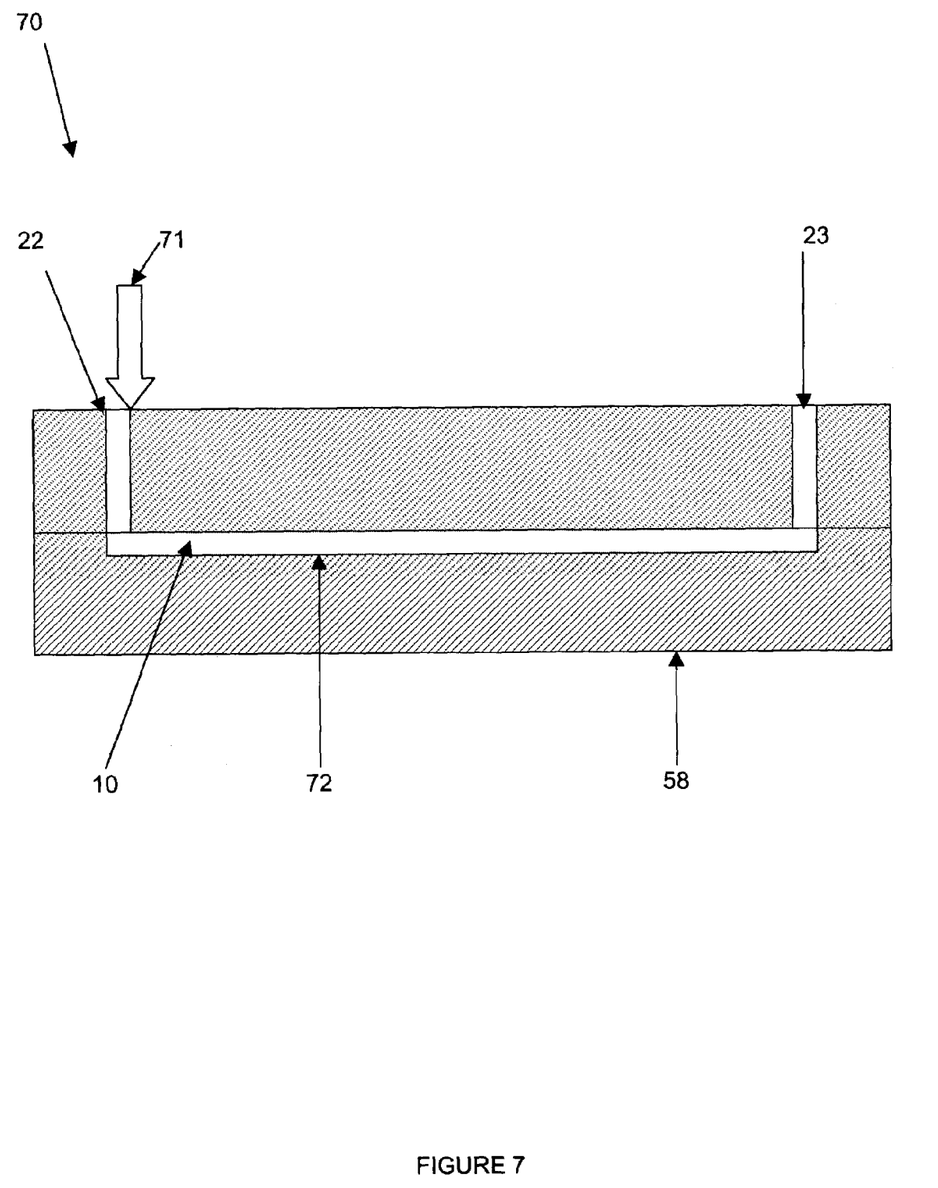
FIG. 7 shows a cross-sectional view of the single channel micro-fluidic device during the blowing agent injection step (or pulling step, if a vacuum is used).

FIG. 7 provides a cross-sectional image 70 of the micro-fluidic device 58 during the gas injection stage of the process. As shown, blowing gas 71 is injected into entry hole 22 to partially displace resin 61 thereby leaving a coating 72 of resin on the walls of cavity 10. The displaced resin exits the cavity through exit hole 23. Any excess blowing gas 71 will also exit through exit hole 23. The pressure and flow rate of gas 71 may be regulated so as to control the thickness of the coating 72 on the walls of cavity 10.

Figure 8:
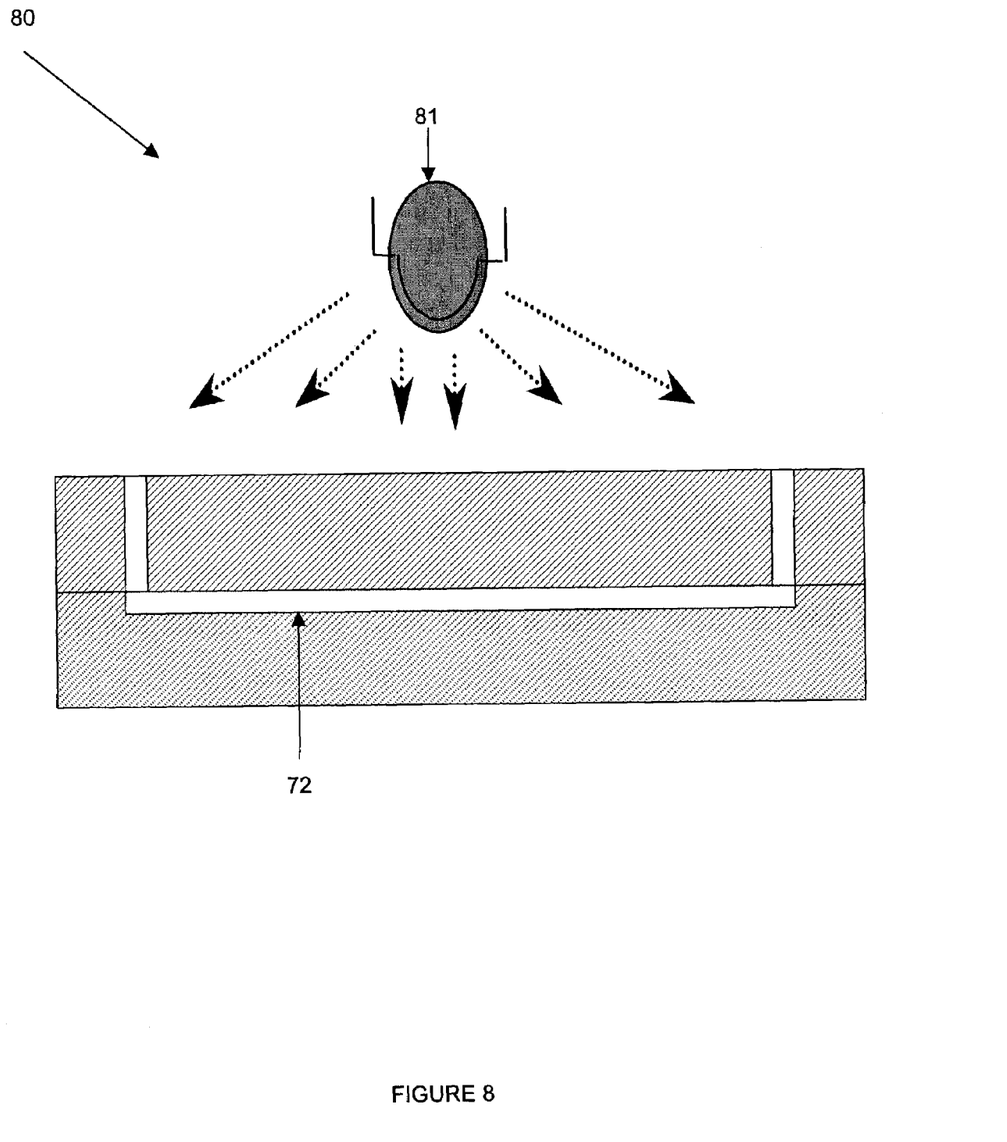
FIG. 8 shows a cross-sectional view of the single channel micro-fluidic device during the curing process.

FIG. 8 provides a cross-sectional image of a curing process 80. In the curing process shown in FIG. 8, a UV light source 81 acts on a UV curable resin to cause the resin to cure, thereby curing coating 72. The curing process of FIG. 8 causes all of the resin to be cured. Where curing all of the resin is not desirable, a masking technique may be employed.

Figure 9:
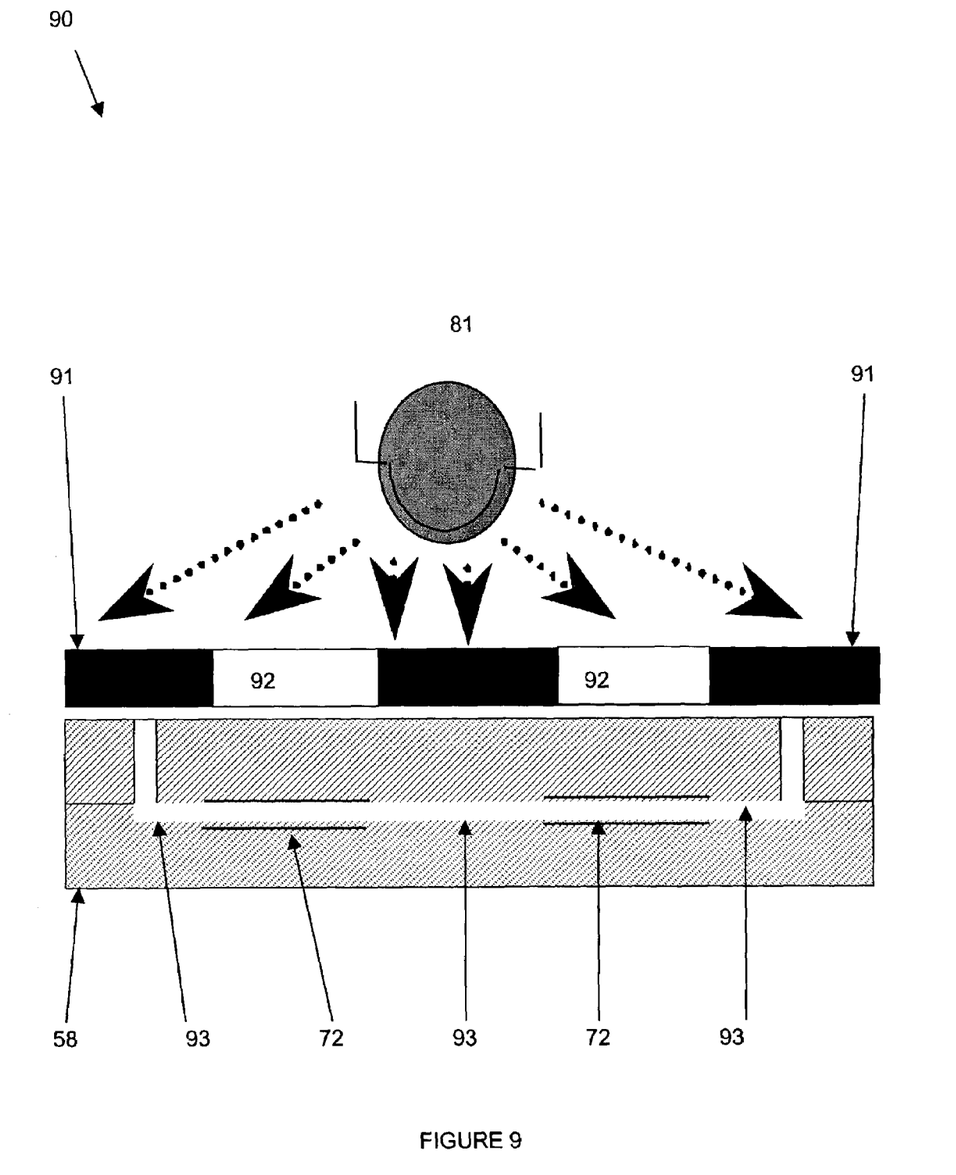
FIG. 9 shows a cross-sectional view of the single channel micro-fluidic device during a selective curing process using a mask to shield portions of the sealing resin from the curing process.

FIG. 9 shows an alternative curing process 90. In the alternative curing process, the micro-fluidic device 58 is fitted with a mask 91. The mask 91 covers portions of the micro-fluidic device 58, thereby shielding portions 93 of the resin from curing. However, openings 92 in the mask permit the UV light from UV light source 81 to cure the coating 72. The masking technique can be employed in multiple resin-gas-cure or resin-gas-mask-cure iterations to develop micro-fluidic devices with highly modified portions possibly comprising multiple layers of cured resins or various regions of different cured resins.

While the invention has been described in connection with what is presently considered to be the most practical and preferred embodiments, it is to be understood that the invention is not to be limited to the disclosed embodiment, but on the contrary, is intended to cover various modifications and equivalent arrangements included within the spirit and scope of the appended claims, which are incorporated herein by reference.

The following references are hereby incorporated by reference:

1. N. A. Alcantar, E. S. Aydil, and J. N. Israelachvili, "Polyethylene glycol-coated biocompatible surfaces," J. Biomed. Mater. Res. 51(3), pp. 343–351 (2000).
2. H. Becker and C. Gartner, "Polymer microfabrication methods for microfluidic analytical applications," Electrophoresis 21, pp. 12–26 (2000).
3. J. H. Chen and E. Ruckenstein, "Surface modification by a two-phase deposition of a surfactant," J. Colloid and Interface Sci. 142(2), pp. 544–553 (1991).
4. H. Dreuth and C. Heiden, "A method for local application of thin organic adhesive films on micropatterned structures", Materials Science and Engineering, C5, pp. 227–231 (1998).
5. K. Gandhi, R. S. Dubrow, and L. J. Bousse, "Methods of fabricating polymeric structures incorporating microscale fluidic elements," U.S. Pat. No. 6,123,798 (2000).
6. I. K. Glasgow, D. J. Beebee, and V. E. White, "Design rules for polyimide solvent bonding", Sensors and Materials, 11(5), pp. 269–278 (1999).
7. L. J. Lee, M. J. Madou, K. W. Koelling, S. Daunert, S. Lai, C. G. Koh, Y-J Juang, Y. Lu, and L. Yu, "Design and fabrication of CD-like microfluidic platforms for diagnostics: microfabrication," Biomedical Microdevice, 3(4), pp. 339–351 (2001).
8. P. Lum and M. Greenstein, "Microfluidic structure assembly with mating microfeatures," U.S. Pat. No. 5,932,315 (1999).
9. D. S. Soane, Z. M. Soane, H. H. Hooper, and M. G. A. Amigo, "Methods for fabricating enclosed microchannel structures," U.S. Pat. No. 6,176,962 (2001).

What is claimed is:

1. A method for forming bonded micro-fluidic devices comprising:
   providing at least one first member and at least one second member in adjacent relation so as to form at least one micro-channel therebetween, said at least one micro-channel having a periphery;
   injecting a sealing resin between said at least one first member and said at least one second member, said sealing resin at least partially filling said at least one micro-channel;
   injecting a blowing agent through said at least one micro-channel so as to at least partially displace said sealing resin to said periphery of said at least one micro-channel thereby forming at least one conduit through said sealing resin, each said conduit having a periphery and adapted for fluid flow;
   curing said sealing resin so as to bond said at least one first member and said at least one second member together thereby forming a bonded micro-fluidic device;
   injecting a second sealing resin into said at least one conduit;
   injecting a second blowing agent through said at least one conduit so as to at least partially displace said second sealing resin to said periphery of said at least one conduit thereby forming at least one sub-conduit, each said sub-conduit adapted for fluid flow; and
   curing said second sealing resin.

2. The method according to claim 1 comprising the additional step of applying a mask to at least a portion of said micro-fluidic device prior to curing so as to selectively shield portions of said micro-fluidic device from said curing.

3. The method according to claim 1 further comprising the steps of:
partially curing said sealing resin so as to be able to separate said at least one first member and said at least one second member;
separating said at least one first member and said at least one second member; and
re-aligning said at least one first member and said second member prior to said curing of said sealing resin so as to bond said at least one first member and said at least one second member together.

4. The method according to claim 1 wherein said at least one first member is constructed of a material selected from the group consisting of polymers, glasses, silicon, metals, and mixtures thereof.

5. The method according to claim 1 wherein said at least one first member is constructed from a material having at least one property selected from the group consisting of: hydrophilic, hydrophobic, protein binding, protein rejecting, electrically conductive, electrically semi-conductive, electrically non-conductive, bioactive, and non-bioactive.

6. The method according to claim 1 wherein said at least one second member is constructed of a material selected from the group consisting of polymers, glasses, silicon, metals, and mixtures thereof.

7. The method according to claim 1 wherein said at least one second member is constructed from a material having at least one property selected from the group consisting of: hydrophilic, hydrophobic, protein binding, protein rejecting, electrically conductive, electrically semi-conductive, electrically non-conductive, bioactive, and non-bioactive.

8. The method according to claim 1 wherein said sealing resin is selected from the group consisting of hydroxyethyl methacrylate, epoxy, urethane, unsaturated polyester, vinylester, and mixtures thereof.

9. The method according to claim 1 wherein said sealing resin is a solvent-based adhesive selected from the group consisting of acrylic, polystyrene, rubber latex, and mixtures thereof.

10. The method according to claim 1 wherein said sealing resin has at least one property selected from the group consisting of: hydrophilic, hydrophobic, protein binding, protein rejecting, electrically conductive, electrically semi-conductive, electrically non-conductive, bioactive, and non-bioactive.

11. The method according to claim 1 wherein said sealing resin comprises at least one additive selected from the group consisting of polyethylene glycol, polyethylene glycol-polypropylene oxide copolymer, surfactants, and combinations thereof.

12. The method according to claim 1 wherein said blowing agent is selected from the group consisting of air, nitrogen, water vapor, and mixtures thereof.

13. The method according to claim 1 wherein said curing is accomplished by a process selected from the group consisting of ultra-violet exposure, visible light exposure, heating, evaporation, and combinations thereof.

14. The method according to claim 2 wherein said mask comprises chrome coated glass.

15. The method according to claim 1 wherein said second sealing resin is selected from the group consisting of hydroxyethyl methacrylate, epoxy, urethane, unsaturated polyester, vinylester, and mixtures thereof.

16. The method according to claim 1 wherein said second sealing resin is a solvent-based adhesive selected from the group consisting of acrylic, polystyrene, rubber latex, and mixtures thereof.

17. The method according to claim 1 wherein said second sealing resin has at least one property selected from the group consisting of:
hydrophilic, hydrophobic, protein binding, protein rejecting, electrically conductive, electrically semi-conductive, electrically non-conductive, bioactive, and non-bioactive.

18. The method according to claim 1 wherein said second blowing agent is selected from the group consisting of air, nitrogen, water vapor, and mixtures thereof.

19. The method according to claim 1 wherein said curing is accomplished by a process selected from the group consisting of ultra-violet exposure, visible light exposure, heating, evaporation, and combinations thereof.

20. The method according to claim 1 additionally comprising the step of applying a second mask to at least a portion of said micro-fluidic device prior to curing said second sealing resin so as to selectively shield portions of said micro-fluidic device from said curing.

21. The method according to claim 20 wherein said second mask comprises chrome coated glass.

22. A method for forming resin conduits in micro-fluidic devices comprising:
providing a micro-fluidic device, said micro-fluidic device comprising at least one micro-channel having a periphery disposed therein;
injecting a resin into at least one micro-channel, said resin at least partially filling said at least one micro-channel;
injecting a blowing agent into said least one micro-channel so as to displace at least a portion of said resin to said periphery of said at least one micro-channel thereby forming at least one conduit, each said conduit having a periphery and adapted for fluid flow;
curing said resin;
injecting a second resin into said at least one conduit;
injecting a second blowing agent through said at least one conduit so as to at least partially displace said second resin to said periphery of said at least one conduit thereby forming at least one sub-conduit, each said sub-conduit adapted for fluid flow; and
curing said second resin.

23. The method according to claim 22 wherein said micro-fluidic device is constructed from a material selected from the group consisting of polymers, glasses, silicon, metals, and mixtures thereof.

24. The method according to claim 22 wherein said micro-fluidic device is constructed from a material having at least one property selected from the group consisting of: hydrophilic, hydrophobic, protein binding, protein rejecting, electrically conductive, electrically semi-conductive, electrically non-conductive, bioactive, and non-bioactive.

25. The method according to claim 22 wherein said resin is selected from the group consisting of hydroxyethyl methacrylate, glues, photocurable resins, solvent based adhesives, epoxy, urethane, unsaturated polyester, vinylester, and mixtures thereof.

26. The method according to claim 22 wherein said resin has at least one property selected from the group consisting of: hydrophilic, hydrophobic, protein binding, protein rejecting, electrically conductive, electrically semi-conductive, electrically non-conductive, bioactive, and non-bioactive.

27. The method according to claim 22 wherein said resin comprises at least one additive selected from the group consisting of polyethylene glycol, polyethylene glycol-polypropylene oxide copolymer, surfactants, and combinations thereof.

28. The method according to claim 22 wherein said blowing agent is selected from the group consisting of air, nitrogen, water vapor, and mixtures thereof.

29. The method according to claim 22 wherein said curing is accomplished by a process selected from the group consisting of ultra-violet exposure, visible light exposure, heating, evaporation, and combinations thereof.

30. The method according to claim 22 additionally comprising the step of applying a mask prior to curing said resin so as to selectively shield portions of said resin from said curing.

31. The method according to claim 30 wherein said mask comprises chrome coated glass.

32. The method according to claim 22 wherein said second resin is selected from the group consisting of hydroxyethyl methacrylate, glues, photocurable resins, solvent-based adhesives, epoxy, urethane, unsaturated polyester, vinylester, and mixtures thereof.

33. The method according to claim 22 wherein said second resin has at least one property selected from the group consisting of: hydrophilic, hydrophobic, protein binding, protein rejecting, electrically conductive, electrically semi-conductive, electrically non-conductive, bioactive, and non-bioactive.

34. The method according to claim 22 wherein said second resin comprises at least one additive selected from the group consisting of polyethylene glycol, polyethylene glycol-polypropylene oxide copolymer, surfactants, and combinations thereof.

35. The method according to claim 22 wherein said second blowing agent is selected from the group consisting of air, nitrogen, water vapor, and mixtures thereof.

36. The method according to claim 22 wherein said curing of said second resin is accomplished by a process selected from the group consisting of ultra-violet exposure, visible light exposure, heating, evaporation, and combinations thereof.

* * * * *